United States Patent
Cho et al.

(10) Patent No.: US 7,841,843 B2
(45) Date of Patent: Nov. 30, 2010

(54) VALVELESS MICRO AIR DELIVERY DEVICE

(75) Inventors: Hye-jung Cho, Gyeonggi-do (KR); Xiao-bing Luo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1532 days.

(21) Appl. No.: 10/959,051

(22) Filed: Oct. 7, 2004

(65) Prior Publication Data

US 2005/0074662 A1 Apr. 7, 2005

(30) Foreign Application Priority Data

Oct. 7, 2003 (KR) .................... 10-2003-0069481

(51) Int. Cl.
*F04B 17/00* (2006.01)
*H05K 5/00* (2006.01)
(52) U.S. Cl. .................................. 417/413.1; 454/184
(58) Field of Classification Search .............. 454/184, 454/185, 238, 241; 417/240, 395, 410.1, 417/241, 555.1, 394, 431.1, 431.2, 431.3
See application file for complete search history.

(56) References Cited

U.S. PATENT DOCUMENTS

| | | | | |
|---|---|---|---|---|
| 2,902,251 | A * | 9/1959 | Oncley ................ 251/129.07 |
| 2,930,324 | A * | 3/1960 | Toulmin, Jr. ............ 417/413.1 |
| 3,165,061 | A * | 1/1965 | Smith et al. .............. 417/199.1 |
| 3,270,672 | A * | 9/1966 | Haines et al. ............... 417/322 |
| 3,360,664 | A * | 12/1967 | Straube ..................... 310/330 |
| 3,587,328 | A * | 6/1971 | Schuemann et al. ...... 73/504.06 |
| 3,606,583 | A * | 9/1971 | Coughenour et al. .......... 417/53 |
| 3,743,446 | A * | 7/1973 | Mandroian .................. 417/240 |
| 3,955,901 | A * | 5/1976 | Hamilton .................... 417/395 |
| 4,407,161 | A * | 10/1983 | Ferrar ..................... 73/504.06 |
| 4,488,854 | A * | 12/1984 | Miller ....................... 417/241 |
| 4,523,901 | A * | 6/1985 | Schippers et al. ........... 417/395 |
| 4,545,561 | A * | 10/1985 | Brown .................... 251/129.08 |
| 4,648,807 | A * | 3/1987 | Tippetts et al. ........... 417/413.2 |
| 4,648,810 | A * | 3/1987 | Schippers et al. ........... 417/383 |
| 4,708,600 | A * | 11/1987 | AbuJudom et al. .......... 417/322 |
| 4,753,579 | A * | 6/1988 | Murphy .................. 417/410.2 |
| 4,808,084 | A * | 2/1989 | Tsubouchi et al. .......... 417/322 |
| 4,830,577 | A * | 5/1989 | Moffatt et al. ................ 417/45 |
| 4,903,732 | A * | 2/1990 | Allen .................... 137/625.65 |
| 4,939,405 | A * | 7/1990 | Okuyama et al. ........... 310/330 |

(Continued)

FOREIGN PATENT DOCUMENTS

EP 0412856 A1 2/1991

(Continued)

*Primary Examiner*—Steve McAllister
*Assistant Examiner*—Helena Kosanovic
(74) *Attorney, Agent, or Firm*—Sughrue Mion, PLLC

(57) ABSTRACT

A micro air delivery device for supplying air to a predetermined space, comprises a jet unit for obtaining and delivering outside air; a cover having a discharge orifice for discharging the outside air delivered from the jet unit; and a base unit connected to the jet unit. Since a valve is not employed to regulate the air supply or delivery, the air delivery device is superior in safety, is of simplified construction, and efficient. Furthermore, the air flow can be controlled by varying the electric current or the frequency, and accordingly, an active delivery of the air is possible.

31 Claims, 8 Drawing Sheets

U.S. PATENT DOCUMENTS

| | | | |
|---|---|---|---|
| 5,020,977 A * | 6/1991 | Lucas | 417/322 |
| 5,066,204 A * | 11/1991 | Point et al. | 417/413.1 |
| 5,079,472 A * | 1/1992 | Uhl et al. | 310/332 |
| 5,215,446 A * | 6/1993 | Takahashi et al. | 417/322 |
| 5,354,032 A * | 10/1994 | Sims et al. | 251/129.06 |
| 5,428,503 A * | 6/1995 | Matsushima et al. | 361/695 |
| 5,525,041 A * | 6/1996 | Deak | 417/63 |
| 5,742,954 A * | 4/1998 | Idland | 4/541.1 |
| 5,759,014 A * | 6/1998 | Van Lintel | 417/413.3 |
| 5,822,653 A * | 10/1998 | Ishii | 399/104 |
| 5,914,856 A * | 6/1999 | Morton et al. | 361/690 |
| 5,982,801 A | 11/1999 | Deak | |
| 6,010,316 A * | 1/2000 | Haller et al. | 417/322 |
| 6,104,607 A * | 8/2000 | Behl | 361/687 |
| 6,113,485 A | 9/2000 | Marquis et al. | 454/184 |
| 6,174,232 B1 * | 1/2001 | Stoll et al. | 454/184 |
| 6,203,291 B1 * | 3/2001 | Stemme et al. | 417/413.3 |
| 6,210,128 B1 * | 4/2001 | Rife et al. | 417/322 |
| 6,232,680 B1 * | 5/2001 | Bae et al. | 310/17 |
| 6,266,243 B1 * | 7/2001 | Tomioka | 361/695 |
| 6,280,149 B1 * | 8/2001 | Able et al. | 417/63 |
| 6,333,852 B1 * | 12/2001 | Lin | 361/697 |
| 6,361,284 B2 * | 3/2002 | Drevet | 417/240 |
| 6,361,294 B1 * | 3/2002 | Witzigreuter et al. | 417/413.3 |
| 6,392,313 B1 * | 5/2002 | Epstein et al. | 290/52 |
| 6,416,293 B1 * | 7/2002 | Bouchard et al. | 417/53 |
| 6,464,476 B2 * | 10/2002 | Ross et al. | 417/478 |
| 6,481,984 B1 * | 11/2002 | Shinohara et al. | 417/413.2 |
| 6,485,263 B1 * | 11/2002 | Bryant et al. | 417/53 |
| 6,487,074 B1 * | 11/2002 | Kimura et al. | 361/695 |
| 6,604,908 B1 * | 8/2003 | Bryant et al. | 417/26 |
| 6,659,740 B2 * | 12/2003 | Drevet | 417/436 |
| 6,663,351 B2 * | 12/2003 | Joo | 417/53 |
| 6,672,847 B2 * | 1/2004 | Dooley | 417/412 |
| 6,720,710 B1 * | 4/2004 | Wenzel et al. | 310/328 |
| 6,759,159 B1 * | 7/2004 | Gray et al. | 429/71 |
| 6,791,835 B2 * | 9/2004 | Hashimoto et al. | 361/687 |
| 6,827,559 B2 * | 12/2004 | Peters et al. | 417/413.2 |
| 2002/0146333 A1 | 10/2002 | Drevet | |

FOREIGN PATENT DOCUMENTS

| | | |
|---|---|---|
| EP | 1020911 A2 | 7/2000 |
| JP | 34-10440 A | 8/1957 |
| JP | 50-146106 A | 5/1972 |
| JP | 03-31589 A | 2/1991 |
| KR | 2000-0050679 A | 8/2000 |
| WO | 96/29751 A1 | 9/1996 |

* cited by examiner

VALVELESS MICRO AIR DELIVERY DEVICE

CROSS-REFERENCE TO RELATED APPLICATIONS

This application claims the benefit of foreign priority from Korean Application No. 2003-69481, filed Oct. 7, 2003, in the Korean Intellectual Property Office, the whole disclosure of which is hereby incorporated herein by reference.

BACKGROUND OF THE INVENTION

1. Field of the Invention

The present invention relates to a micro air delivery device, and more specifically, a micro air delivery device capable of actively supplying a certain amount of air to a predetermined space in a valveless structure.

2. Description of the Related Art

Generally, a micro air delivery device is used for supplying a certain amount of air to a small electronic machine or a part. There has been an increase in demand for a micro air delivery device as the use of portable electronic devices such as laptop computers, PDAs, and mobile phones has become popular, especially for fuel cells used in such portable electronic devices. Further, micro air delivery devices are required in supplying appropriate amounts of air to critical parts of computers such as certain chips, or, more generally, for cooling parts by circulating air.

Small fuel cells employed in portable electronic devices such as conventional mobile phones or PDAs that use micro air delivery devices include the following: PAFC (Phosphoric Acid Fuel Cell), AFC (Alkaline Fuel Cell), PCMFC (Proton Exchange Membrane Fuel Cell), MCFC (Molten Carbonate Fuel Cell), SOFC (Solid Oxide Fuel Cell), and DMFC (Direct Methanol Fuel Cell), according to the type of fuel, running temperature, catalyst utilized and electrolyte employed.

An air delivery device used with a DMFC, which has recently shown substantial performance, will be explained as an example.

The DMFC generates electric power using methanol fuel and oxygen to cause a chemical reaction in an MEA (membrane and electrode assembly). The chemical reaction is described in detail as the following.

The DMFC comprises a membrane 15, an anode 16 and a cathode 17 which are disposed at both sides of the membrane 15, as shown in FIG. 1. In anode 16, the methanol and water react to generate a hydrogenous ion and an electron. The reaction formula is expressed in a [Reaction formula 1] as follows.

$$CH_3OH + H_2O = CO_2 + 6H^+ + 6e^+ \qquad \text{[Reaction formula 1]}$$

In cathode 17, the hydrogen ion generated from anode 16 moves through membrane 15 and combines with oxygen to generate water. The reaction formula thereof is expressed in a [Reaction formula 2] as follows.

$$1.5\, O_2 + 6H^+ + 6e^- = 3H_2O \qquad \text{[Reaction formula 2]}$$

The whole reaction formula in the fuel cell is expressed in a [Reaction formula 3] as follows.

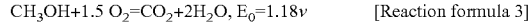

$$CH_3OH + 1.5\, O_2 = CO_2 + 2H_2O,\ E_0 = 1.18v \qquad \text{[Reaction formula 3]}$$

As described above, the DMFC converts chemical energy generated through the whole chemical reaction to electric energy, and supplies it to an electronic device.

In such a chemical reaction, usually oxygen, one of the reactants, can be directly supplied from the surrounding air, and the methanol fuel cell is supplied by a natural air convection system or an active air supply system. For an active air supply system, a flow supplying apparatus such as a check valve-type pump or a MEMS-type pump can be used to supply a predetermined air or flow.

However, in most cases, a natural air convection system is employed for supplying air due to size limitations. In this situation, an orifice structure which is directly connected to the outside air is provided to supply air to the MEA.

FIG. 2 illustrates an air delivery device of a natural air convection system with the above structure. Such an air delivery device is disclosed in U.S. Pat. No. 6,497,975B2.

As shown in FIG. 2, the outside air is directly delivered to an MEA 20 through a plurality of orifices 25 formed in a main body 30. However, this type of micro air delivery device has several problems.

First, where the air delivery device is used with diverse electric devices such as mobile phones or the PDAs, a user usually holds the device by a hand. Therefore, orifice 25 which is an air path formed for the air delivery device, or a similarly situated cavity can be covered by the user's hand. As a result, air flow can become constricted. Further, orifice 25 can also be blocked by secretions from the hand.

Second, since the reaction in the MEA is exothermic, the surface temperature of the MEA is relatively high compared to the outside air temperature. Therefore, because of this temperature difference, it is unnatural for air to flow into and through orifice 25.

Third, it is hard to control the amount of air flow required. That is, with respect to different portable electronic devices, different degrees of power are required according to respective modes of use. Accordingly, different amounts of air flow are required for different devices. However, conventional air delivery devices are not able to control the flow of the air. In addition, the air delivery rate or flow for natural convection is comparatively low, and consequently, it is not adequate in generating electric power.

SUMMARY OF THE INVENTION

Embodiments of the present invention overcome the above-mentioned problems in the related art. Accordingly, it is an aspect of an embodiment of the present invention to provide an improved valveless micro air delivery device which is able to actively supply a flow of air as necessary.

In order to achieve the above-described aspects of the present invention, there is provided a micro air delivery device comprising a jet unit for air intake and delivery, a cover having a discharge orifice for discharging the outside air delivered from the jet unit, and a base connected to the jet unit.

The jet unit comprises a jet plate having a plurality of orifices, a reservoir body disposed beneath the jet plate and between the jet plate and the base unit, and a plurality of gaskets mounted at sides of the reservoir body. The plurality of orifices preferably comprise a jet orifice formed in the center of the jet plate, and a suction orifice formed at a predetermined distance from the jet orifice on the jet plate. The suction orifice is positioned symmetrically with respect to the jet orifice, and the discharge orifice has a diameter approximately two or more times as large as the diameter of the jet orifice.

In a preferred embodiment of the present invention, the suction orifice has a diameter smaller than the diameter of the discharge orifice, and larger than the diameter of the jet orifice. The height between the discharge orifice and the jet orifice is preferably three times larger than the diameter of the jet orifice.

The reservoir body may have a cavity which is open upward and downward. The reservoir body further comprises a membrane being disposed therebeneath to seal a lower space of the cavity. Further, a magnetic sheet is formed beneath the membrane and directed toward the base unit.

The magnetic sheet may be formed from a gummy material. A gasket is disposed between the base unit and the jet plate. In a preferred embodiment of the present invention, the gasket is formed thicker than the reservoir body to allow the air to flow in. The base unit comprises a base plate connected to the gasket and a circular coil disposed corresponding to the magnetic sheet in the center of the base plate, to generate a magnetic force when energized with electricity.

A portion of the base plate corresponding to the gasket is thicker than the remaining portion to allow the air to flow in. The cover includes a cover cavity inside which fluidly communicates with the discharge orifice. The cover cavity is shaped in a polygon to guide the intake air. The width of an upper portion of the cover cavity, which fluidly communicates with the discharge orifice, is smaller than width of a lower portion which fluidly communicates with the jet unit.

The cover, the jet plate of the jet unit, the gasket, and the base plate are preferably connected by a fastening unit, and the fastening unit can be comprised of a bolt and a nut.

BRIEF DESCRIPTION OF THE DRAWINGS

These and other features, aspects, and advantages of exemplary embodiments of the present invention will be better understood with regard to the following description, appended claims, and accompanying drawings where:

DETAILED DESCRIPTION OF THE EXEMPLARY EMBODIMENTS

Hereinafter, a micro air delivery device according to an embodiment of the present invention will be described in detail with reference to the accompanying drawings. For convenience, an example of the micro air delivery device applied to a portable fuel cell is described.

Figure 1:
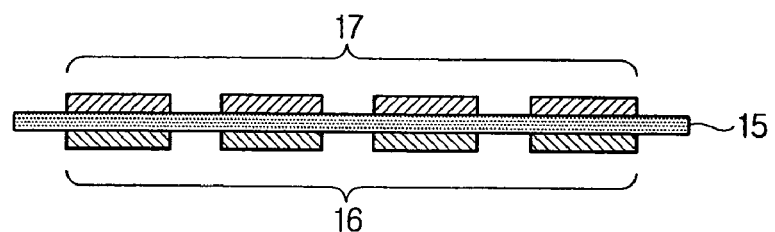
FIG. 1 is a schematic view of a direct methanol fuel cell.
Figure 2:
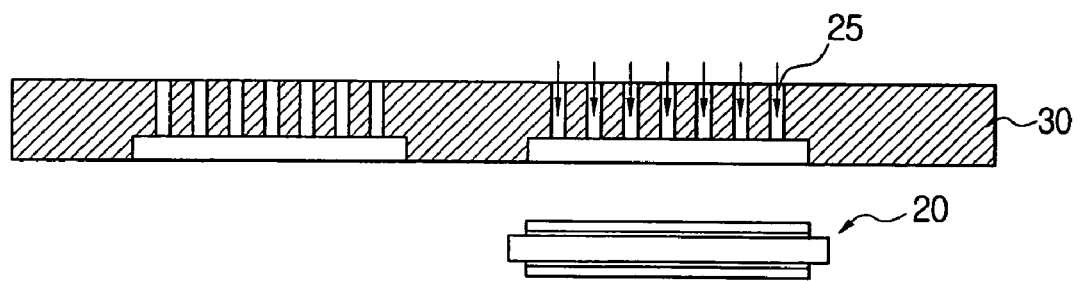
FIG. 2 is a view of an air delivery device of a natural convection system.
Figure 3:
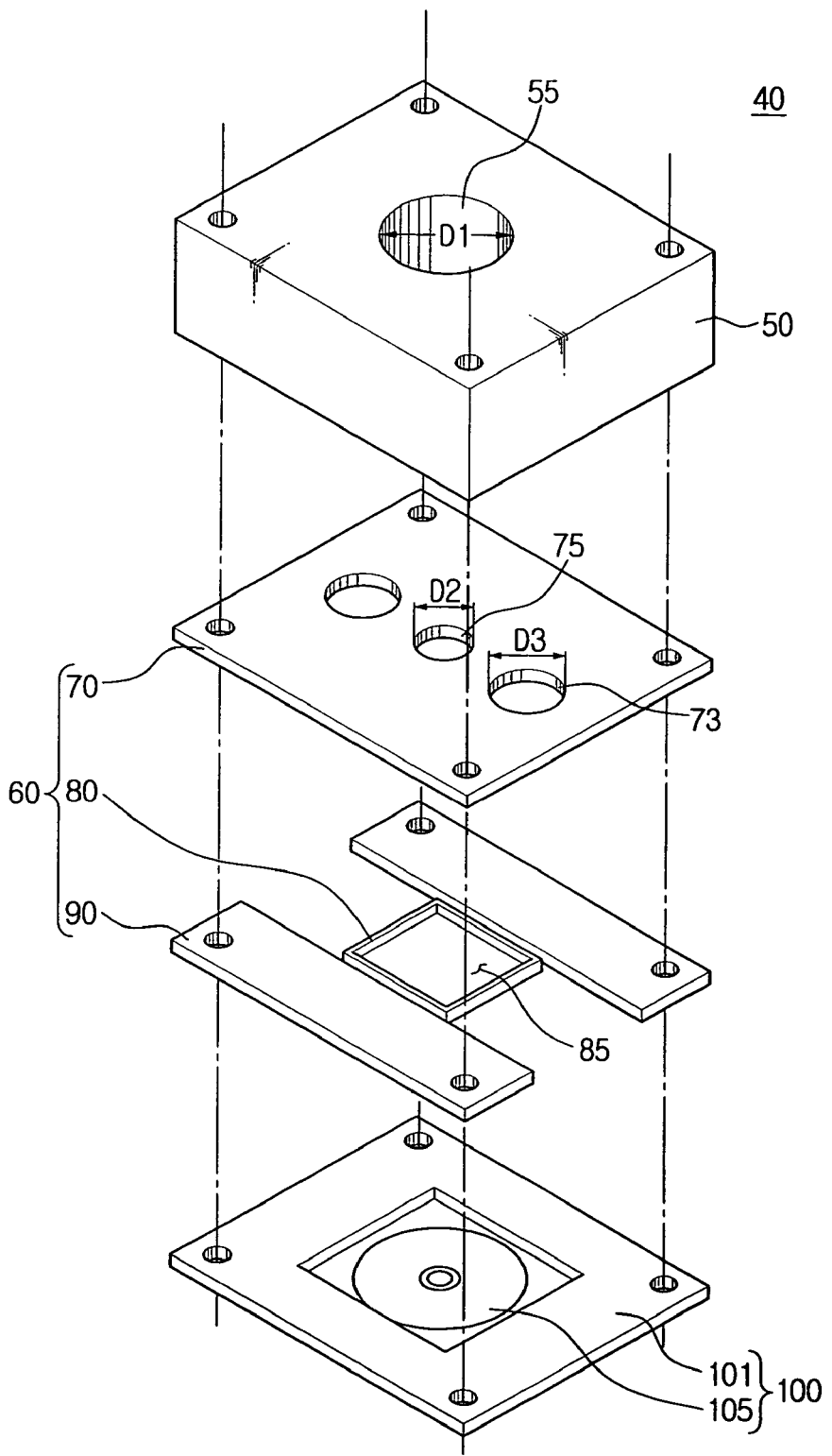
FIG. 3 is an exploded perspective view showing the main parts of a micro air delivery device consistent with an embodiment of the present invention.

As shown in FIG. 3, a micro air delivery device 40 consistent with concepts of the present invention comprises a jet unit 60, a cover 50, and a base unit 100.

The jet unit 60 sucks in outside air and delivers it to a predetermined space. The jet unit 60 includes a jet plate 70, a reservoir body 80, and a plurality of gaskets 90. The jet plate 70 has a plurality of orifices including a jet orifice 75 formed in the center of the jet plate 70, and a suction orifice 73. The suction orifice 73 is formed on the jet plate 70 at a predetermined distance from the jet orifice 75. The number of suction orifices 73 can be two or more.

The suction orifices 73 are formed symmetrically with respect to the jet orifice 75. Through the suction orifices 73, the outside air flows into the air delivery device 40. Here, a diameter D1 of a discharge orifice 55 of the cover part 50 is twice as large, or more, as a diameter D2 of the jet orifice 75. In addition, a diameter D3 of the suction orifice 73 is within a range between the diameter D1 of the discharge orifice 55 and the diameter D2 of the jet orifice 75. A height H between the discharge orifice 55 and the jet orifice 75 is approximately three times larger than the diameter D2 of the jet orifice 75. (See FIG. 4)

The reservoir body 80 is disposed beneath the jet plate 70 and between the jet plate 70 and the base unit 100. Inside the reservoir body 80, cavity 85 is formed which is open upward and downward. The cavity 85 temporarily holds the air flowing from the suction orifice 73 before it flows into the jet orifice 75. As pressure inside the jet orifice 75 changes, the air temporarily held in the cavity 85 is discharged to cover cavity 57 of the cover part 50 through the jet orifice 75.

Figure 4:
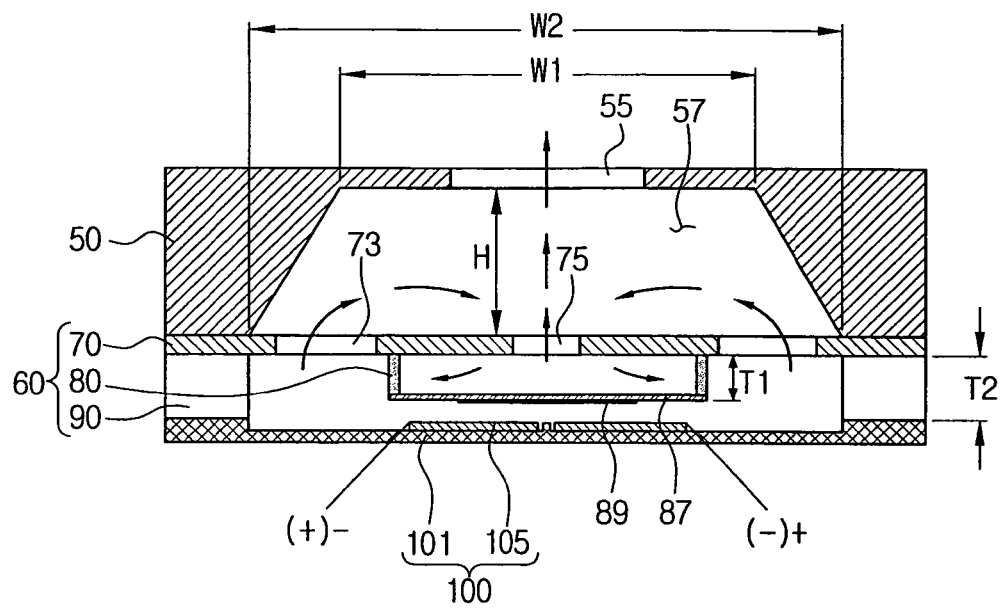
FIG. 4 is a sectional view of a micro air delivery device consistent with an embodiment of the present invention.

Referring to FIG. 4, the reservoir body 80 comprises a membrane 87 disposed beneath the reservoir body 80 and sealing a lower space of the cavity, and a magnetic sheet 89 disposed beneath the membrane 87. The magnetic sheet 89 is formed preferably by a permanent gummy material.

The gasket 90 of the jet unit 60 is disposed between the base unit 100 and the jet plate 70, or if necessary, it can be disposed about the sides of the cavity 85. Thickness T2 of the gasket 90 is larger than thickness T1 of the reservoir body 80 to allow the air to flow in.

The base unit 100 comprises a base plate 101 and a circular coil 105. The base plate 101 is connected to gasket 90 so as to allow the air to flow in, and a portion thereof corresponding to the gasket 90 is formed thicker than at the center. The circular coil 105 is disposed in the center of the base plate 101 corresponding to the magnetic sheet 89 of the jet unit 60, and generates a magnetic force when energized with electric power. Furthermore, the circular coil 105 includes an electric circuit (not shown) for periodically applying electric power.

The cover 50 has a cover cavity 57 formed therein and connected to the discharge orifice 55. The cover cavity 57 is polygon shaped to guide the intake air. Here, an upper part of the cover cavity 57 fluidly communicates with the discharge orifice 55, and a lower part of the cover cavity 57 fluidly communicates with the jet unit 60. Width W1 of the upper part is smaller than width W2 of the lower part.

As a whole, the cover 50, the jet plate 70 of the jet unit 60, the gasket 90, and the base plate 101 are connected by a fastening unit (not shown) which may be comprised of a bolt and a nut. The fastening unit (not shown) may be formed in any practical manner so long as the cover part 50, the jet plate 70, the gasket 90, and the base plate 101 are all connected.

With reference to FIGS. 3 through 7, the operation of the micro air delivery device 40 according to an embodiment consistent with concepts of the present invention is described. When the circular coil is energized with the electric power by the electric circuit (not shown), a magnetic field is generated and exerted in a upward or downward direction with respect to the base plate 101 according to Fleming's rule. The magnetic field has a N-S polarity, and reacts with the magnetic sheet 89 disposed beneath the membrane 87.

At this moment, the magnetic sheet 89 has a specific polarity such as N pole or S pole. When the magnetic sheet 89 has the N polarity, the magnetic sheet 89 reacts with the N-S polarity of the magnetic field, and therefore, an upward or a downward force is generated with respect to the base plate 101. In case that the magnetic sheet 89 has the S polarity, the same effect results.

The generated magnetic field compresses membrane 87 having the magnetic sheet 89 attached into the cavity 85, or expands the membrane 87 out of the cavity 85. As a result, the membrane 87 vibrates. The vibration of the membrane 87 corresponds to the frequency of the applied electric power from the electric circuit and causes a pressure difference inside the cavity 85.

The pressure difference in the cavity 85 enables surrounding air to flow in or be discharged through the jet orifice 75. Furthermore, the diameter D2 of the jet orifice 75 depends on the vibration amplitude of the membrane 87 of the air delivery device 40. The larger the vibration amplitude, the larger diameter D2 of the jet orifice 75 becomes.

When the pressure of the cavity 85 is relatively low compared to the surrounding pressure, the surrounding air flows in and converges into the cover cavity 57 through the suction orifice 73, and here, most of the intake air is delivered to the cavity 85 through the jet orifice 75. Thus, the inflow of the air into the cavity 85 is achieved. The collected air is temporarily stored in the cavity 85.

At this time, when the electric power is applied in the opposite direction to the initial state according to the periodical change in the electric circuit, the inside pressure of the cavity 85 becomes higher than the surrounding pressure. Accordingly, the air stored in the cavity 85, which has higher pressure than the surrounding air, is discharged to the cover cavity 57 through the jet orifice 75, and then discharged to a predetermined space through the discharge orifice 55. Since the diameter D2 of the jet orifice 75 is smaller than the diameter D1 of the discharge orifice 55, an air flow is created.

Figure 8:
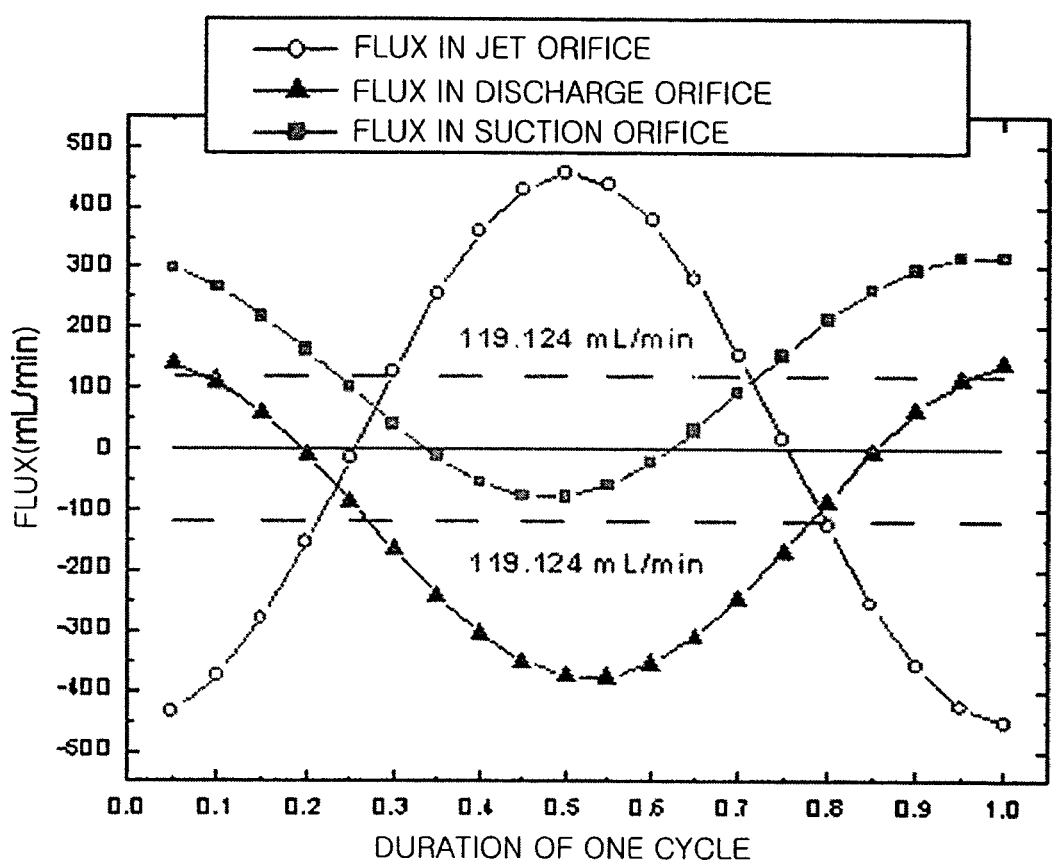
FIG. 8 shows an air flow in a micro air delivery device having a plurality of suction orifices.

To compare the flow of the intake air with jetted air, referring to FIG. 8, in one cycle wherein the intake air is sucked in and discharged, the air flow in and discharged through the jet orifice 75 are equivalent. More specifically, the flow rate through the jet orifice 75 in one cycle can be expressed as a function of Amplitude multiplied by $\text{Sin}(\omega t)$, i.e., $A\,\text{Sin}(\omega t)$ where $\omega = 2\pi f = 2000\pi$. As such, the air flow through the suction orifice 73 can be expressed as $119.124 + A\,\text{Sin}(\omega t)$ mL/min, and the air flow discharged through the discharge orifice 55 can be expressed as $-119.124 + A\,\text{Sin}(\omega t)$ mL/min.

Obviously, by integration in one cycle, the above three equations indicate the averaging flow rate in one cycle. They are 0, 119.124, and −119.124 respectively. The above values are also the same as the calculation value by total area under each respective curve in one cycle.

In FIG. 8, positive values with respect to the air flow in mL/min indicate air flow into the air delivery device, and negative values indicate air flow discharged from the air delivery device to the predetermined space.

Figure 5:
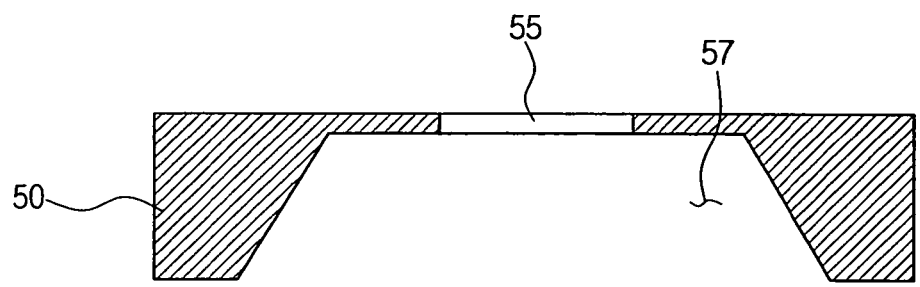
FIG. 5 is a sectional view of a cover of a micro air delivery device consistent with an embodiment of the present invention.
Figure 5:
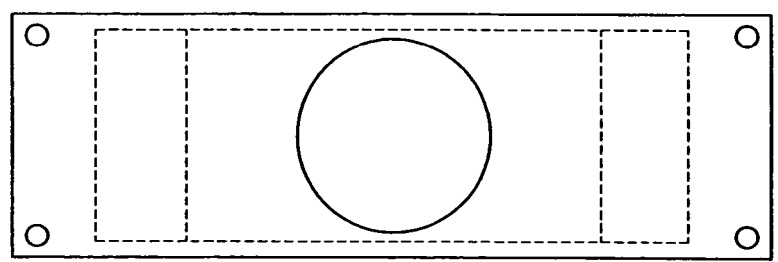
Figure 6:
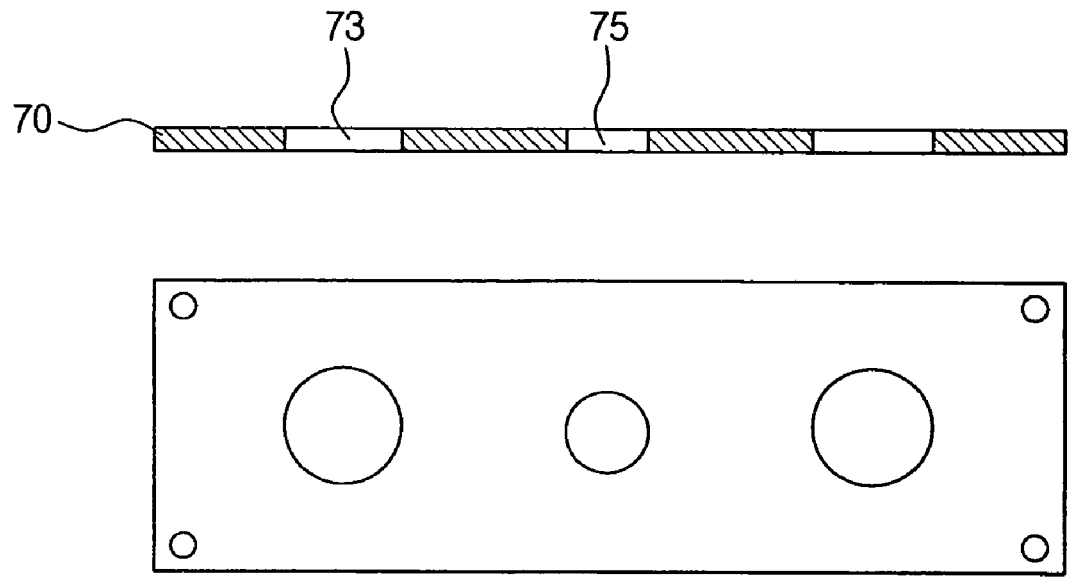
FIG. 6 is a sectional view of a base plate of a micro air delivery device consistent with an embodiment of the present invention.
Figure 7:
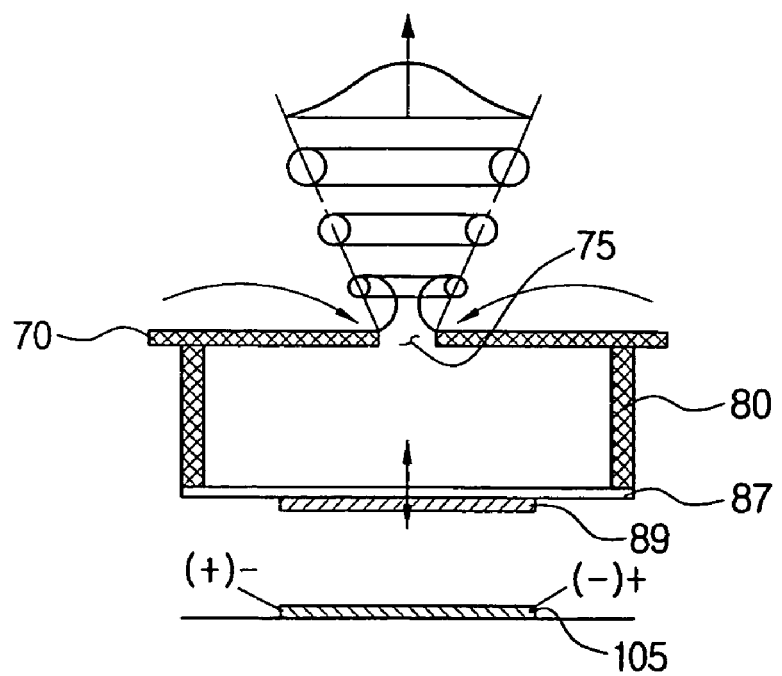
FIG. 7 shows the operation of a micro air delivery device consistent with an embodiment of the present invention.

The embodiment described in FIG. 5 is a coupled mechanical/electrical/fluid flow model, it is very difficult to take into account all flow, mechanical and electrical parameters in simulation. In order to accurately simulate the flow characteristic and amount of delivery flow rate, a simplified model is adopted. Obviously, the boundary condition at the jet orifice is a factor for getting the proper flow information of the present pump.

Air is the calculation material for present simulation. The unsteady, three-dimensional, incompressible, Reynolds-averaged Navier-Stokes (RANS) equations are solved. Standard k–ε turbulence model is used. It has been proved that the simulation results by using the above method can achieve good agreement with experiment results. Commercial code FLUENT 6.1 is used here.

The corresponding boundary conditions of the present model are as follows. For a synthetic jet orifice, it belongs to the blowing/suction boundary condition. The following equation can simulate the jet orifice 75 effectively.

$$(\underline{u}(\xi=0,\eta,t)=U_o f(\eta)\text{Sin}(\omega t) \tag{1}$$

Where $\xi$ denotes the streamwise direction, $\eta$ denotes the cross-stream direction, and $\underline{u}$ is the streamwise component of velocity, $\omega$ is angle frequency of the actuator. Owing to that the orifice size is very small, the orifice velocity can be regarded as same along the cross-stream direction, it means that $f(\eta)=1$, thus equation (1) can be rewritten as, $$(\underline{u}(\xi=0,\eta,t)=U_o \text{Sin}(\omega t) \tag{2}$$

For the suction orifice 73 and discharge orifice 55, the natural pressure boundary conditions are adopted in simulation. In the computations, the diameters of jet and suction orifices (75 and 73, respectively) are 1 mm. The discharge orifice 55 diameter is 2 mm. The height of the cover cavity 57 is 2.5 mm, and other main dimensions can be found from FIG. 4. Based on the experiments with synthetic jet actuators, the orifice averaging maximum velocity Uo is assumed as 10 m/s and the actuator's frequency is 1000 Hz.

The convergence studies on grids, time steps in one cycle and maximum iteration times in one time step are conducted before the calculation. They are refined until the flow field changes by 0.8%. Finally, 16542 grids and 20 time steps per cycle are used in the simulation. The residual control of continuity equation is 0.01%.

Figure 9:
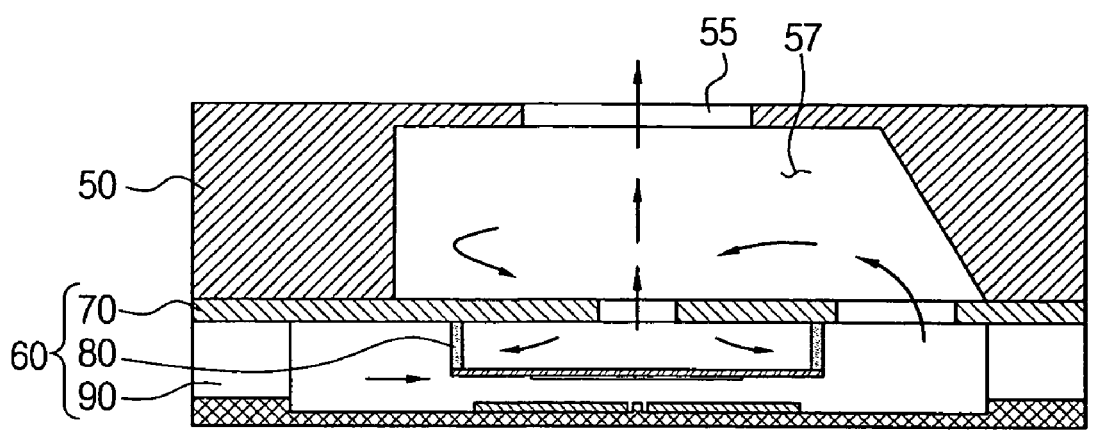
FIG. 9 is a sectional view of a micro air delivery device having one suction orifice.

FIG. 9 shows the dependence of flow rate on time in one cycle. The averaging flow rate flowing through each boundary is marked by the dash line. All three curves are Sine types. It can be seen that in one cycle, the net flow rate at the jet orifice 75 is 0, the averaging flow rate into the system from the suction orifice 73 is 119.124 mL/min, and the averaging flow rate flowing out of the system to delivery destination from the discharge orifice 55 is 119.124 mL/min. The above data demonstrates that in one cycle, air from the suction orifice 73 enters into the system and is delivered out to its destination from the discharge orifice 55. As such, the jet cavity 85 and cover cavity 57 function as temporary storage areas.

During one cycle, the outside air flows into the air delivery device 40 through the suction orifice 73, and is finally discharged through the discharge orifice 55. Here, although the flow of the intake air and the flow of the discharged air are the same, as a whole, the positive values of air flow in the air delivery device through the suction orifice 73 are more than the negative values. Therefore, the air delivery device basically functions as a micro pump.

Thus, cavity 85 serves as a temporary reservoir, and according to the present invention, the air flow discharged through the discharge orifice 55 is larger than that in a conventional air delivery device of a natural convection system.

Unlike a conventional device, the micro air delivery device according to an embodiment consistent with the concepts of the present invention basically functions as a small pump without the need of a regulation valve. Furthermore, by varying the electric current or the frequency of the power from the electric circuit, the air flow discharged to the jet orifice 75 is controlled. Accordingly, an active air delivery is implemented.

FIG. 9 is another embodiment consistent with concepts of the present invention having a different structure of the jet unit 60 of the air delivery device 40. Referring to FIG. 9, the jet plate 70 of the jet unit 60 has a single suction orifice 73 around the jet orifice 75. The other parts are all the same as the air delivery device 40 as described.

Figure 10:
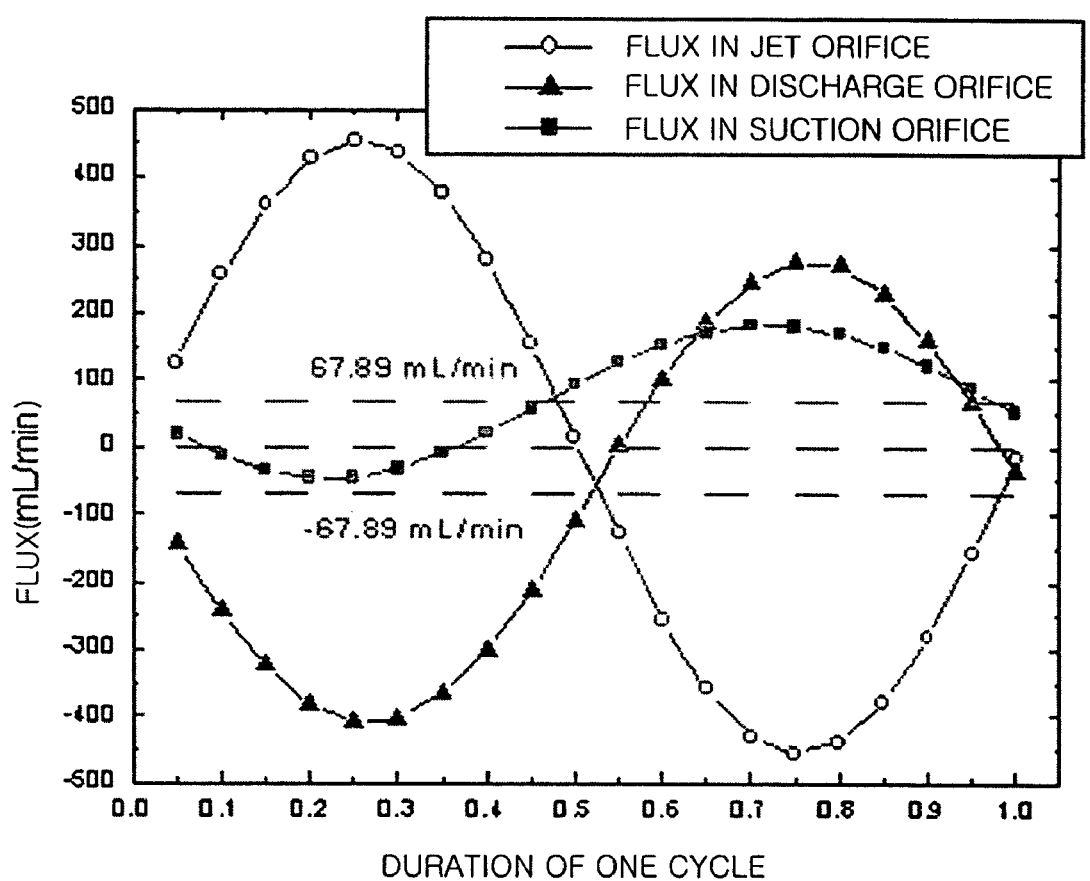
FIG. 10 shows an air flow in a micro air delivery device having one suction orifice.

Regarding the air flow of the air delivery device 40 having one suction orifice 73, referring to FIG. 10, in the cycle wherein the air is brought in and discharged, the air flow in and discharged through the jet orifice 75 are the same as in FIG. 8. Specifically, the air flow in through the suction orifice 73 is 67.89 mL/min, and the air flow discharged through the discharge orifice 55 is 67.89 mL/min.

This means that there is a difference only in the whole delivery and discharge flow of the air delivery device 40. As a whole, the air flowing into the suction orifice 73 is a positive. Consequently, a predetermined amount of the air is constantly brought in during the suction-discharge cycle. Accordingly, the air delivery device functions as a valveless micro pump capable of supplying a required air flow to the predetermined space as in FIG. 8.

An embodiment applying the above air delivery device will be described with reference to FIG. 11. A plurality of the air delivery devices 40 may be formed at one side of an air delivery unit 150. The air delivery unit 150 may be formed about the exterior of the fuel cell of the electric devices such as a general mobile phone or a PDA. However, this is only by way of an example, and exteriors of other air delivery devices can be employed.

Here, since the air delivery device 40 is disposed at one side of the air delivery unit 150, when a user grasps the fuel cell, the suction orifice 73 of the air delivery device 40 is not obstructed by the user's hand.

Figure 11:
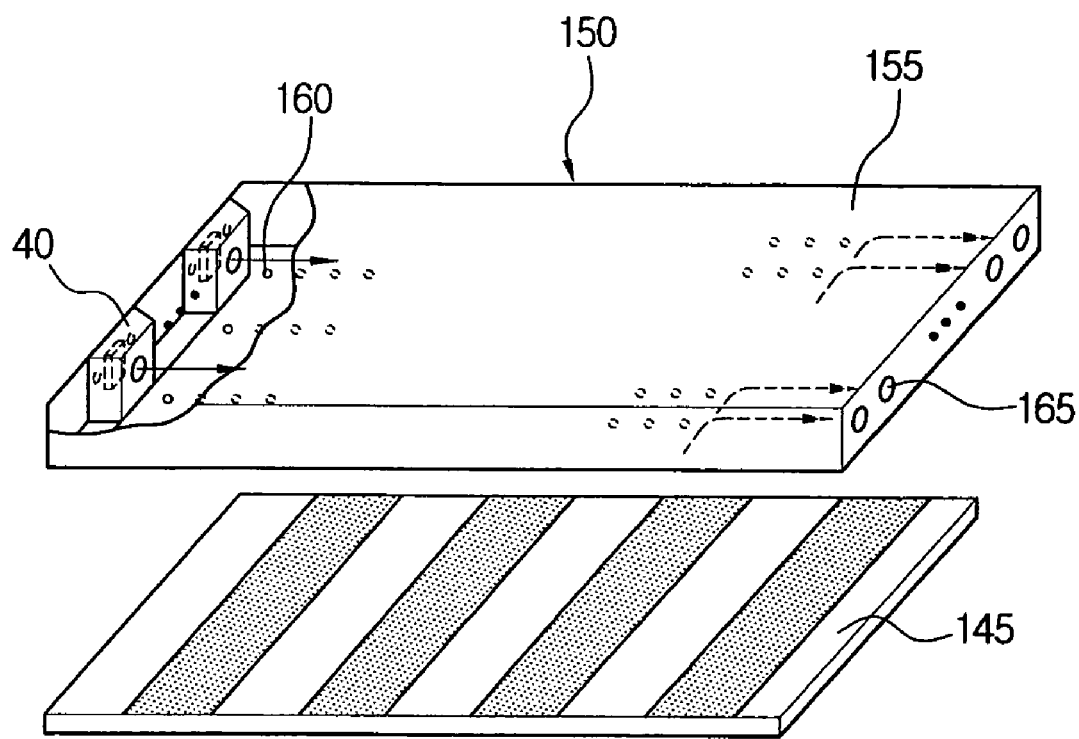
FIG. 11 shows an air delivery unit employing a micro air delivery device consistent with an embodiment of the present invention.

As in FIG. 11, periodically a predetermined amount of air is discharged into the air delivery unit 150 periodically in the air delivery devices 40. The discharged air is transferred to the surface of the MEA 145 through a first orifice 160 which is formed at a lower part of a body 155 of the air delivery unit 150, and reaction heat is generated by a chemical reaction at the MEA surface. The reaction heat meets the intake air, and therefore, the MEA surface is cooled.

A by-product, i.e., carbon dioxide, caused by the chemical reaction of the MEA is discharged through a second orifice 165 of the air delivery device 40. Here, a diameter of the second orifice 165 is almost the same as the diameter D2 of the jet orifice 75 of the air delivery device 40.

Although an embodiment of the air delivery device 40 wherein the air is discharged to the MEA surface has been described, if necessary, the air delivery device 40 can be used for air-cooling or air-supplying small heat generating parts, i.e., a CPU or a semiconductor chip.

In addition, although the above air delivery device uses a circular coil for pumping or supplying the air, if necessary, other piezoelectric or electrostatic devices can also be employed.

As described above, according to embodiments consistent with concepts of the present invention, to implement the air supply or delivery in a simple structure, a valve is not required or used. Therefore, the air delivery device is superior in safety, and air delivery efficiency is enhanced.

Furthermore, the air rate discharged to the jet orifice 75 can be controlled by varying the electric current or the frequency, and accordingly, an active delivery of the air is possible. Moreover, the electric devices can be miniaturized by adopting the air delivery device according to the present invention.

While the invention has been shown and described with reference to certain embodiments thereof, it will be understood by those skilled in the art that various changes in form and details may be made therein without departing from the spirit and scope of the invention as defined by the appended claims.

What is claimed is:

1. A micro air delivery device comprising:
    a jet unit having a cavity to obtain and deliver outside air through a single orifice;
    a cover having a discharge orifice for discharging the outside air delivered from the jet unit; and
    a base unit connected to the jet unit wherein the jet unit comprises:
    a jet plate having a plurality of orifices including the single orifice;
    a reservoir body disposed beneath the jet plate, and between the jet plate and the base unit; and
    a plurality of gaskets mounted along sides of the reservoir body;
    Wherein the plurality of orifices comprises:
    a jet orifice formed in the center of the jet plate and forming the single orifice; and
    a suction orifice formed at a predetermined distance from the jet orifice on the jet plate.

2. The micro air delivery device of claim 1, comprising a plurality of suction orifices positioned symmetrically with respect to the jet orifice.

3. The micro air delivery device of claim 2, wherein the discharge orifice has a diameter twice as large or more as a diameter of the jet orifice which establishes an airflow starting from the reservoir body through the jet orifice to the discharge orifice for discharging the outside air from the micro air delivery device.

4. The micro air delivery device of claim 3, wherein one of the plurality of suction orifices has a diameter smaller than the diameter of the discharge orifice, and larger than the diameter of the jet orifice.

5. The micro air delivery device of claim 3, wherein a height between the discharge orifice and the jet orifice is approximately three times larger than the diameter of the jet orifice.

6. The micro air delivery device of claim 1, wherein the cavity is formed to be open upward in the reservoir body, wherein the reservoir body further comprises a membrane disposed therebeneath to seal a lower space of the cavity.

7. The micro air delivery device of claim 6, further comprising a magnetic sheet disposed beneath the membrane and directed toward the base unit, wherein the magnetic sheet is bonded to a lower surface of the membrane, and the lower surface of the membrane is opposite to an upper surface of the membrane which defines the lower space of the cavity of the reservoir body.

8. The micro air delivery device of claim 7, wherein the magnetic sheet is formed from a deformable material.

9. The micro air delivery device of claim 8, wherein a gasket is disposed between the base unit and the jet plate.

10. A micro air delivery device comprising:
    a jet unit for obtaining and delivering outside air;
    a cover having a discharge orifice for discharging the outside air delivered from the jet unit; and
    a base unit connected to the jet unit,
    wherein the jet unit comprises:
    a jet plate having a plurality of orifices;
    a reservoir body disposed beneath the jet plate, and between the jet plate and the base unit;

a plurality of gaskets mounted along sides of the reservoir body; and a gasket disposed between the base unit and the jet plate, the reservoir body has a cavity which is open upward, wherein the reservoir body further comprises a membrane disposed therebeneath to seal a lower space of the cavity, and a magnetic sheet disposed beneath the membrane and directed toward the base unit, wherein the magnetic sheet is bonded to a lower surface of the membrane, and the lower surface of the membrane is opposite to an upper surface of the membrane which defines the lower space of the cavity of the reservoir body, the magnetic sheet being formed from a deformable material, and wherein the gasket disposed between the base unit and the jet plate is formed thicker than the reservoir body so as to allow the air to flow in to the reservoir body.

11. The micro air delivery device of claim 10, wherein the base unit comprises:
a base plate connected to the gasket disposed between the base unit and the jet plate; and
a circular coil disposed on an upper surface of the base plate, facing the magnetic sheet, and which generates a magnetic force upon being energized with electricity.

12. The micro air delivery device of claim 11, wherein a part of the base plate corresponding to the gasket disposed between the base unit and the jet plate is thicker than another part of the base plate so as to allow air to flow in.

13. The micro air delivery device of claim 1, wherein the cover includes a cover cavity inside which fluidly communicates with the discharge orifice.

14. The micro air delivery device of claim 13, wherein the cover cavity is polygon-shaped to guide intake air.

15. The micro air delivery device of claim 14, wherein a width of an upper part of the cover cavity, which fluidly communicates with the discharge orifice, is smaller than a width of a lower part which fluidly communicates with the jet unit.

16. The micro air delivery device of claim 9, wherein the base unit comprises:
a base plate connected to the gasket disposed between the base unit and the jet plate; and
a circular coil disposed adjacent to the magnetic sheet and which generates a magnetic force upon being energized with electricity.

17. A micro air delivery device comprising:
a jet unit for obtaining and delivering outside air;
a cover having a discharge orifice for discharging the outside air delivered from the jet unit; and
a base unit connected to the jet unit,
wherein the jet unit comprises:
a jet plate having a plurality of orifices;
a reservoir body disposed beneath the jet plate, and between the jet plate and the base unit;
a plurality of gaskets mounted along sides of the reservoir body; and
a gasket disposed between the base unit and the jet plate, the reservoir body has a cavity which is open upward, wherein the reservoir body further comprises a membrane disposed therebeneath to seal a lower space of the cavity, and a magnetic sheet disposed beneath the membrane and directed toward the base unit, wherein the magnetic sheet is bonded to a lower surface of the membrane, and the lower surface of the membrane is opposite to an upper surface of the membrane which defines the lower space of the cavity of the reservoir body, and wherein the base unit comprises:
a base plate connected to the gasket disposed between the base unit and the jet plate; and
a circular coil disposed adjacent to the magnetic sheet and which generates a magnetic force upon being energized with electricity,
wherein a part of the base plate corresponding to the gasket disposed between the base unit and the jet plate is thicker than another part of the base plate so as to allow air to flow in.

18. The micro air delivery device of claim 1, wherein the jet unit comprises a plurality of gaskets which are mounted along sides of the jet unit and disposed abutting a lower surface of the jet plate and abutting an upper surface of the base unit, and the sides of the jet unit form a portion of an outer periphery of the micro air delivery device, and
the discharge orifice defines an air pathway extending through a wall of the cover.

19. The micro air delivery device of claim 1, wherein the jet plate is disposed between the cover and the base unit, internally within the micro aid delivery device.

20. The micro air delivery device of claim 1, wherein the jet unit obtains the outside air through the plurality of gaskets from which the outside air is delivered to a cavity of the reservoir body.

21. The micro air delivery device of claim 1, wherein the jet orifice and the suction orifice are formed internal to the micro air device.

22. The micro air delivery device of claim 21, wherein the outside air enters and exits the reservoir body through the jet orifice.

23. The micro air delivery device of claim 22, wherein the suction orifice forms an air pathway, extending through a wall of the jet plate, between the jet unit and a cover cavity of the cover.

24. The micro air delivery device of claim 23, wherein the cover includes the cover cavity inside which fluidly communicates with the discharge orifice.

25. The micro air delivery device of claim 9, wherein the jet unit obtains the outside air through the gasket disposed between the base unit and the jet plate from which the outside air is delivered to the cavity of the reservoir body.

26. The micro air delivery device of claim 10, wherein the air flows in through the gasket disposed between the base unit and the jet plate to the reservoir body.

27. The micro air delivery device of claim 11, wherein the circular coil is aligned beneath the magnetic sheet.

28. The micro air delivery device of claim 27, wherein the magnetic force generated by the circular coil reacts with the magnetic sheet to exert a normal force on the membrane.

29. The micro air delivery device of claim 28, wherein the normal force is an upward force or a downward force acting on the membrane such that the membrane is compressed or expanded, respectfully, according to the generated magnetic force applied to the magnetic sheet.

30. The micro air delivery device of claim 29, wherein the normal force alternates between the upward force and the downward force, causing a vibration of the membrane corresponding to a frequency of an applied electric power, and the vibration of the membrane causing a pressure difference inside the cavity of the reservoir body.

31. The micro air delivery device of claim 30, wherein the membrane is formed from a deformable material.

* * * * *